United States Patent

[11] 3,588,530

[72] Inventor Marion J. Langan
Huntsville, Ala.

[21] Appl. No. 875,262
[22] Filed Nov. 10, 1969
[45] Patented June 28, 1971

[73] Assignee Avco Corporation
Huntsville, Ala.

[54] COMPUTER CIRCUIT
14 Claims, 3 Drawing Figs.

[52] U.S. Cl. .......... 307/229, 307/230, 307/235, 307/251, 330/330D, 340/347AD
[51] Int. Cl. .......... G06g 7/12, H03k 5/20
[50] Field of Search .......... 307/229, 230, 235; 330/30 (D); 340/347 (AD)

[56] References Cited

UNITED STATES PATENTS 3,509,474 4/1970 Arnold et al. .......... 307/229
3,521,272 7/1970 James .......... 340/347

*Primary Examiner*—Donald D. Forrer
*Assistant Examiner*—B. P. Davis
*Attorney*—Lowe and King

ABSTRACT: A digital-to-analog converter includes a differential, operational amplifier having a negative feedback path from the amplifier output terminal to the amplifier inverting input terminal and a series impedance connected between the amplifier inverting input terminal and a voltage source, which may be fixed or variable. Connected in shunt with the amplifier inverting input terminal and ground is a variable resistance controlled in response to digital control signals. A predetermined percentage of the voltage of the source is connected to the amplifier noninverting input terminal. The relative magnitudes of the feedback and input impedances and the predetermined percentage of the voltage applied to the noninverting input terminal are adjusted so that the amplifier output voltage is proportional to a predetermined constant of the input voltage divided by the magnitude of the shunt impedance. A constant current source supplies bias current to the amplifier via the inverting input terminal.

INVENTOR,
MARION J. LANGAN

BY Lowe & King
ATTORNEYS

COMPUTER CIRCUIT

The present invention relates generally to computer circuits and, more particularly, to a computer circuit including a differential negative feedback operational amplifier having an impedance in shunt with an inverting input terminal of the amplifier and a predetermined percentage of the voltage of a source driving the amplifier is fed to a noninverting input terminal of the amplifier.

Operational amplifier circuits have frequently been utilized in the past for deriving an output voltage related to a pair of variable signals fed to the amplifier. In general, such circuits have included a variable analog input source driving the amplifier and a variable impedance controlled in response to a second source. Such circuits have found considerable use in digital-to-analog converters wherein a digital signal source controls the value of a variable resistance connected in series between the amplifier input terminal and the analog source. The resulting impedance variations coupled to the analog source due to changes of the variable resistance are of no consequence if the source impedance is essentially zero. In many instances, however, such a source impedance is not available and changes in the value of the resistance cause variable loading of the source, resulting in changes of the source voltage to produce inaccuracies in the amplifier output voltage. This is a problem regardless of whether the analog source is variable or of constant voltage. For instance, if the analog source is a constant voltage derived from a Zener diode, the changing load imposed on the source by the variable resistance considerably modifies the source voltage, particularly if a potentiometer is utilized to trim the value of the source voltage to a desired magnitude.

The variable resistances employed for digital-to-analog converters usually are ladder networks having a multiplicity of fixed resistances selectively shunted in response to digital control signals. The shunt circuit for each resistance preferably comprises an electronic switch and is most advantageously a field effect transistor because such a transistor provides zero voltage offset and extremely high open circuit to short circuit impedance ratios. A problem in utilizing field effect transistors for such switches in converters wherein the variable resistance is in series between the amplifier input terminal and a voltage source is that charge is accumulated between the field effect transistor gate electrode and source and/or drain electrodes while the switch is in an open circuited condition. In response to the field effect transistor being switched into the closed condition, the charge on the interelectrode capacitance is dissipated either into the analog voltage source or the amplifier input terminal. The flow of current from the field effect transistor interelectrode capacitance to the analog voltage source or amplifier input terminal changes the voltage applied to the amplifier and affects the accuracy of the amplifier output voltage, particularly for low magnitudes.

In accordance with the present invention, these problems in the prior art are obviated by providing an operational amplifier circuit wherein the impedance level presented by the amplifier to an analog voltage source remains constant, despite impedance variations introduced in the circuit in response to a signal source. To this end, the operational amplifier is of the differential type, including inverting and noninverting input terminals. A fixed impedance is connected in series between the analog voltage source and amplifier inverting input terminal and a second fixed impedance provides a negative feedback path from the amplifier output terminal to the inverting input terminal. Connected in shunt between the inverting input terminal and ground is a variable resistance, the value of which is controlled in response to command signals such as are derived from a digital source. The noninverting input terminal of the amplifier is responsive to a predetermined percentage of the analog voltage source. The percentage of the voltage of the source applied to the noninverting terminal is related to the ratio of the amplifier input and feedback impedances in such a manner as to enable the amplifier output voltage to be directly proportional to a predetermined constant times the analog input voltage divided by the magnitude of the impedance shunting the inverting input terminal.

The high gain nature of the operational amplifier and the negative feedback path maintains the voltage at the amplifier inverting input terminal equal to the voltage at the noninverting input terminal. Thereby, the current flowing from the analog voltage source through the amplifier input resistance to the amplifier inverting input terminal remains constant for any particular voltage of the analog source, despite variations in the impedance shunting the amplifier inverting input terminal to ground. Thereby, the analog voltage source is not differentially loaded in response to variations of the variable impedance and the aforementioned problems of the prior art concerned with loading of the signal source are obviated.

By employing a variable resistance in shunt with the amplifier inverting input terminal and ground, the problems of the prior art concerned with the use of field effect transistors are obviated. In particular, any charge on the interelectrode capacitance between the gate and source or drain electrodes of switching field effect transistors is dissipated directly to ground and current does not flow into the amplifier input terminal or the analog voltage source in response to the transistors being switched.

A further advantage of the present invention is that it is applicable to use with bipolarity analog signals. The response of the network to voltages of either positive or negative polarity is identical, a response I believe is nonexistent in any commercially available digital-to-analog converter. Because the circuit of the present invention can be utilized with bipolarity voltage sources, it can be employed as a two quadrant hybrid multiplier, wherein one signal is a variable amplitude, bipolarity analog signal source and the other signal is a coded digital signal source which varies the resistance of the variable impedance in shunt with the amplifier inverting input terminal.

Another feature of the present invention is that any bias current required by the amplifier need not be supplied by the signal source. Instead, a constant current generator can be connected to the inverting input terminal of the amplifier to supply all of the amplifier bias requirements to further preclude the possibility of variably loading the analog voltage source.

It is, accordingly, an abject of the present invention to provide a new and improved computer circuit utilizing an operational amplifier and a variable impedance.

Another object of the present invention is to provide a computer circuit utilizing an operational amplifier wherein impedance variations in response to a signal source do not affect loading of a voltage source driving the amplifier.

A further object of the invention is to provide an operational amplifier circuit including fixed input and feedback impedances and a further, variable impedance which does not load a voltage source driving the amplifier.

Still another object of the present invention is to provide a new and improved digital-to-analog converter or analog scaling circuit including an operational amplifier wherein variations of impedance in response to changes of the digital signal or scaling factor do not differentially load the analog source driving the network.

Still another object of the present invention is to provide a new and improved digital-to-analog converter or analog scaling network responsive to bipolarity voltage sources.

Yet another object of the present invention is to provide a computer circuit including an operational amplifier connected in circuit with a variable impedance, the value of which is controlled by switching field effect transistors and wherein current generated in response to dissipation of charge built up on the field effect transistor interelectrode capacitance does not adversely effect the amplifier operation.

The above and still further objects, features and advantages of the present invention will become apparent upon consideration of the following detailed description of one specific embodiment thereof, especially when taken in conjunction with the accompanying drawings, wherein.

Figure 1:
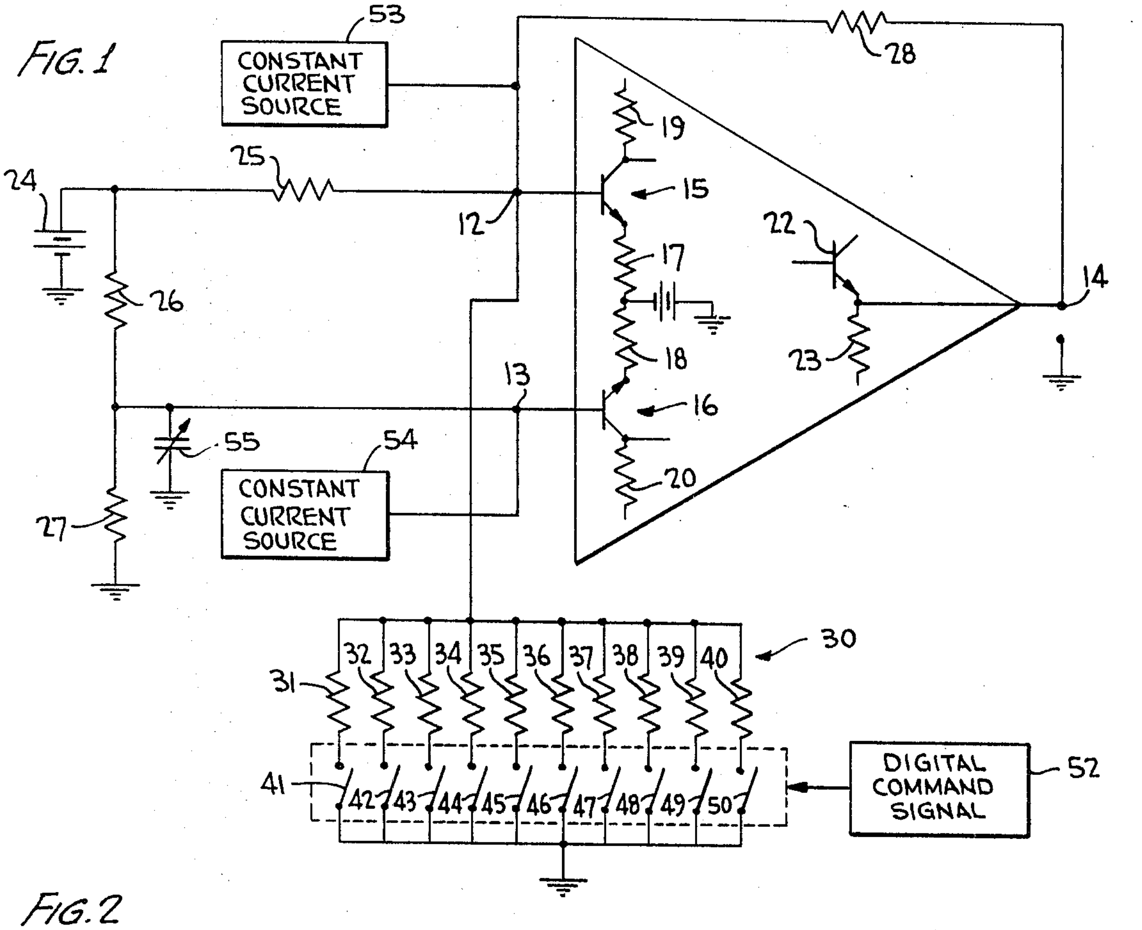
FIG. 1 is a circuit diagram of a preferred embodiment of the present invention.

Reference is now made to FIG. 1 of the drawings wherein there is illustrated a DC, high gain operational amplifier 11 of the differential type. Amplifier 11 includes first and second input terminals 12 and 13, respectively, and output terminal 14. Circuitry is arranged within amplifier 11 such that the voltage developed at output terminal 14 is directly proportional to the difference of the voltages at input terminals 12 and 13 and the voltage at the output terminal is of the same polarity as the voltage at terminal 13 but of the opposite polarity from the voltage at input terminal 12. Hence, terminals 12 and 13 are referred to as the amplifier inverting and noninverting input terminals.

Amplifier 11 is preferably of the integrated circuit type including bipolar NPN transistors 15 and 16, the bases of which are connected directly to terminals 12 and 13, respectively. The emitters of transistors 15 and 16 are connected to a negative DC power supply through resistors 17 and 18, respectively, while the collectors thereof are connected to a positive DC power supply through load resistors 19 and 20. The amplifier includes a low impedance output stage comprising common collector, NPN transistor 22, having an emitter resistance 23 across which the amplifier output voltage is developed at terminal 14. Circuitry, of a type well known to those skilled in the art and therefore not shown, within amplifier 11 is such that the amplifier open loop gain is at least 40,000. Typical of amplifiers having these characteristics is the Fairchild 709 operational amplifier.

Connected to inverting input terminal 12 of amplifier 11 are analog voltage source 24 and the amplifier series input resistance 25. Voltage source 24 may be either AC or DC a constant or variable, depending upon the use of the circuit. If the circuit is employed for digital-to-analog conversion purposes, source 24 is a constant amplitude voltage of either positive or negative polarity, while the source is a variable amplitude, bipolarity voltage when the circuit is employed as a hybrid multiplier, i.e., a circuit for multiplying analog signal values by digital command signals. The selection of source 24 as being of the AC or DC type is dependent upon the remainder of the system with which the circuitry of the present invention is employed.

A predetermined percentage of the voltage of source 24 is fed to noninverting input terminal 13 of amplifier 11. To this end, a voltage divider including resistors 26 and 17 shunts source 24. A tap between resistances 26 and 27 is connected directly to the noninverting input terminal 13 of amplifier 11.

A negative feedback path including resistor 28 is provided between the output terminal 14 of amplifier 11 and the amplifier inverting input terminal 12. Feedback resistor 28, in combination with the high gain and inverting properties of amplifier 11, maintains the voltage at terminal 12 at the same magnitude and polarity as the voltage at noninverting input terminal 13. This occurs in a manner well known to those skilled in the art and because any difference in the voltage amplitudes at terminals 12 and 13 is greatly magnified by amplifier 11 and fed back to terminal 12 through resistor 28 to stabilize the voltage at terminal 12 so that it is equal to the voltage at terminal 13.

To scale the voltage of source 24, a variable impedance 30 is connected in shunt with inverting amplifier input terminal 12 and ground. Preferably, variable impedance 30 includes a multiplicity of fixed parallel resistances 31—40 selectively connected in circuit by switches 41—50, respectively. Switches 40—50 are selectively closed in response to a ten bit digital command signal derived from source 52 while the values of resistors 31—40 are designed in such a manner as to enable digital scaling of the voltage of the source 24 to be preformed.

To provide the bias current required by transistor 15, constant current source 53 is connected directly to the base of transistor 15 through input terminal 12. The current fed to the base of transistor 15 by constant current source 53 is such that no bias current is supplied to the transistor by the signal source 24 regardless of the resistance inserted into the network by variable impedance 30. Thereby, terminal 12 draws zero current from source 24 and the voltage across resistor 25 is always equal to the voltage of source 24 minus the voltage at inverting input terminal 12, which is stabilized to the voltage at the tap between resistors 26 and 27.

To prevent voltage offset at output terminal 14, constant current source 54 is connected to the base of transistor 16 via noninverting input terminal 13. The current supplied by source 54 to the base of transistor 16 is selected so that the voltage at output terminal 14 is maintained at zero with a zero input voltage of source 24. Prior to the circuit being put into operation, the voltage of source 24 is adjusted to zero and voltmeters are connected between ground and each of terminals 12 and 14. Constant current sources 53 and 54 are adjusted until the voltages at terminals 12 and 14 are both zero, at which time the required values of current supplied by sources 53 and 54 are achieved. With certain amplifiers, the need for constant current source 54 is obviated as such amplifiers are connected internally across circuitry of the amplifier such that connection externally of the variable resistance across these terminals enables simple adjustment of the amplifier output voltage to a zero level under the condition of zero input voltage. (An example of an integrated circuit amplifier which incorporates this facility is the Fairchild UA741.)

To enable the circuit of the present invention to have a relatively large response to frequencies up to the 10 kHz. range, capacitor 55 is connected in shunt between noninverting input terminal 13 and ground. The value of capacitor 55 is selected to provide a voltage phase lag at the tap between resistors 26 and 27 which is comparable to the phase lag occurring at inverting input terminal 12 in response to the extraneous capacitance added to the noninverting input by the connections of resistors 31—40 through switches 41—50. By maintaining the two-phase lags substantially equal, the amount of signal feed through of the amplifier feedback network is substantially reduced to enable the frequency response of the circuit to be extended from approximately 1 kHz. to 10 kHz.

In accordance with one preferred embodiment, the values of resistors 25, 26, 27 and 28 are all equal, having a value of R, and the resistance of variable impedance 30 is stepped between R/2 and infinity in response to different ones of switches 41—50 being opened and closed. In response to all of switches 41—50 being closed, the value of impedance 30 is the minimum value, R/2, while the maximum value of infinity is achieved in response to all of the switches being open circuited.

With resistors 25—28 having equal values and impedance network 30 being an open circuit, the voltage at terminal 14 is maintained at a zero level regardless of the amplitude and/or polarity of the voltage of source 24. This result occurs because the voltage at noninverting input terminal 13 is maintained at one-half of the voltage of source 24 due to the voltage dividing effects of equal valued resistors 26 and 27. The high gain and negative feedback properties of amplifier 11 and resistor 28 maintain the voltage at inverting input terminal 12 at the same voltage as is supplied to noninverting terminal 13, $E_{in}$12. Thereby, the voltage across resistor 25 is maintained at $E_{in}$12. The currents flowing through resistors 25 and 28 are equal because all of the bias current for transistor 15 is supplied by source 53. Thereby, the voltage drop across resistor 28 is identical to the voltage drop across resistor 25 but the current through resistor 28 flows toward inverting input terminal 12. Thereby, the voltage at output terminal 14 is maintained at a zero value.

Next assume that the resistance of impedance 30 is decreased to its minimum value, R/2, in response to each of switches 41—50 being closed by digital command signal source 52. The voltage at terminal 12 is maintained at $E_{in}/2$ despite the change in the value of impedance 30 because of the high gain properties of amplifier 11 and the negative feedback path including resistor 28. Thereby, the current flowing through resistor 25 when the value of impedance 30 is R/2 is the same as the current supplied through the resistance while impedance 30 is an open circuit. Current, however, flows from inverting input terminal 12 to ground through each of resistors 31—40. The total current through resistors 31—40 has a magnitude of $$\frac{\frac{E_{in}}{2}}{\frac{R}{2}}$$

Since all of the current supplied to the base of transistor amplifier 15 is derived from constant current source 53 regardless of the resistance of impedance 30, the sum of the currents flowing through resistors 25 and 28 equals the current flowing through impedance 30. The additional current required by impedance 30 is supplied by feedback resistance, so that the current flowing through resistor 28 is equal to $E_{in}/R$. In response to the increased current flowing through resistance 28, the voltage at terminal 14 increases to $E_{in}$ from a zero value in response to all of switches 41—50 being activated from the open to the closed condition.

To enable the digital-to-analog converter or digital scaling functions to be performed, the values of resistors 31—40 are selected or weighted in such a manner as to enable the output voltage at terminal 14 to equal the voltage of source 24 multiplied by the ratio of a digital input command to a full scale input command. For the 10-bit system illustrated, wherein source 52 includes 10 signal bits which selectively derive command signals for closing switches 41—50, the value of resistor 31 is selected in such a manner that the current flowing through it in response to switch 41 being closed is $\frac{512}{1023}$ of the current flowing through impedance 30 when all of switches 41—50 are closed. The value of resistor 32 is selected to be twice that of resistor 31 and the values of resistances 33—40 progressively increase by double the magnitude of the adjacent resistors so that:

$$R_1=\frac{1023}{1024}R$$

$$R_{32}=2^1\cdot R_{31}=\frac{1023}{512}R$$

$$R_{33}=2^2\cdot R_{31}=\frac{1023}{256}R$$

$$R_{34}=2^3\cdot R_{31}=\frac{1023}{128}R$$

$$R_{35}=2^4\cdot R_{31}=\frac{1023}{64}R$$

$$R_{36}=2^5\cdot R_{31}=\frac{1023}{32}R$$

$$R_{37}=2^6\cdot R_{31}=\frac{1023}{16}R$$

$$R_{38}=2^7\cdot R_{31}=\frac{1023}{8}R$$

$$R_{39}=2^8\cdot R_{31}=\frac{1023}{4}R$$

$$R_{40}=2^9\cdot R_{31}=\frac{1023}{2}R$$

Thereby, in response to a 10-bit digital command signal source 52, switches 41—50 can be opened and closed with 1023 different combinations and permutations and the value of the voltage derived at terminal 14 can be adjusted in 1023 equal increments from zero to a full scale value of $E_{in}$.

In essence, variable impedance 30 functions to divide the voltage of source 24 so that the voltage at terminal 14 is directly proportional to a predetermined constant times the voltage of source 24 divided by the resistance of impedance 30. The predetermined constant is determined by the relative values of resistors 25, 26, 27 and 28. These resistors must be selected in accordance with:

$$\frac{R_{25}}{R_{26}}=\frac{R_{28}}{R_{27}} \quad (1)$$

If the values of resistors 25—28 are not selected in accordance with equation (1), the output voltage derived at terminal 14 is not inversely proportional to the value of impedance 30, but is a complicated function of the value of impedance 30. The relative values of resistors 25—28 and the minimum resistance of impedance 30 can be adjusted in such a manner as to enable the voltage at terminal 14 to be greater or smaller than $E_{in}$ for each of switches 41—50 being closed, thereby providing respectively a circuit gain of greater than, or smaller than, unity.

The derivation of equation (1) results from the following analysis, wherein the value P is the total series resistance of resistors 25 and 28, $y$ equals the ratio of the value of resistor 25 to the total series resistance of resistors 25 and 28, i.e., $$\frac{R_{25}}{R_{25}+R_{28}}$$

$(1-y)$ is the fraction of resistor 28 relative to the total series resistance of resistors 25 and 28, i.e., $$\frac{R_{28}}{R_{25}+R_{28}}$$

$x$ is the fraction of the voltage of source 24 derived from the tap between resistors 26 and 27 and is therefore equal to $$\frac{R_{27}}{R_{27}+R_{26}}$$

(where $R_{27}$ and $R_{28}$ are the values of resistors 27 and 28, respectively), and z is the fraction of the resistance value of impedance 30 relative to the total series resistance of resistors 25 and 28, $$\frac{R_{30}}{R_{25}+R_{28}}$$

Because the voltage at inverting input terminal is maintained at the same magnitude and polarity as the voltage at noninverting input terminal 13, $xE_{in}$, and the sum of the signal currents flowing into inverting input terminal 12 equals zero since all of the bias current of transistor 15 is supplied by source 53:

$$\frac{E_{in}-xE_{in}}{yP}+\frac{(-E_o-xE_{in})}{(1-y)P}-\frac{xE_{in}}{zP}=0 \quad (2)$$

where $E_0$ equals the voltage at output terminal 14. SImplifying and rearranging equation (2) and solving the Equation for $E_0$, yields:

$$E_o=\frac{E_{in}}{y}\left[x+y-1+\frac{xy}{z}(1-y)\right] \quad (3)$$

In order to simplify equation (3) so that the output voltage is a predetermined constant times the value of the variable resistance of impedance 30, $x+y=1$ (4). This simplification yields:

$$E_o=\frac{E_{in}}{y}\left[\frac{xy}{z}(1-y)\right]=E_{in}\frac{x}{z}(1-y)=\frac{E_{in}}{z}(1-y)^2 \quad (5)$$

From equation (4), and substituting for the values of $x$ and $y$, equation (1) is readily derived. Substituting for $x$ and $y$ in equation (5) and simplifying yields:

$$E_o=\frac{\left(\frac{E_{in}}{R_{30}}\right)}{R_{25}+R_{28}}\left(\frac{R_{28}}{R_{25}+R_{28}}\right)^2=\frac{E_{in}(R_{28})^2}{R_{30}(R_{25}+R_{28})} \quad (6)$$

From equation (6), it is seen that the maximum full scale voltage at terminal 14 is governed by the relative values of resistances 25 and 28 divided by the resistance of variable impedance 30. To confirm the physical analysis made supra, wherein the values of resistors 25 and 28 are equal and the value of resistance 30 is $R_{25}/2$, with the mathematical analysis, substitution into equation (6) yields:

$$E_o = \frac{E_{in}(R_{25})^2}{\frac{R_{25}}{2}(2R_{25})} = E_{in} \qquad (7)$$

so that the same result is achieved from both analyses.

Figure 2:
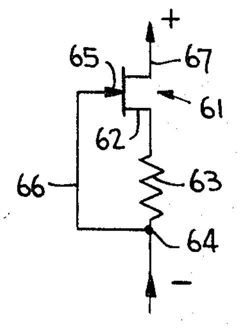
FIG. 2 is a preferred embodiment of a constant current source of the type employed in the circuit of FIG. 1.

The constant current source comprises a field effect transistor 61, FIG. 2, having a source electrode 62 connected through resistance 63 to terminal 64. Terminal 64 is connected directly to gate electrode 65 via lead 66. In operation, the circuit performs as a two terminal constant current device where terminal 64 is always the negative terminal and terminal 67 is always the positive terminal; the potential difference between terminals 64 and 67 must be large enough to produce sufficient current flow through resistor 63 to provide a stable positive bias potential at terminal 62 with respect to gate 65 such that any variation in the potential difference between terminals 64 and 67 results in a relatively insignificant change in current flow. (For example, for potentials in excess of 5 volts between terminals 64 and 67 the circuit as utilized in conjunction with FIG. 1 is approximately equivalent to 1,000 megohms connected to a 1,000-volt source to provide a relatively constant 1 microampere of current in the face of small changes in the 1,000 volt potential. A vacuum tube cathode follower is analogous to this circuit when the grid is grounded and a large cathode resistance is employed; an increase in plate potential causes a very small increase in current flow which further biases the tube to increase the cathode to plate resistance.)

Terminal 64 of constant current source 53 is connected to inverting terminal 12 and terminal 67 is connected to the positive source potential of the operational amplifier in order to satisfy the bias current requirements for transistor 15, typically on the order of 1 microampere. In contrast, the manner in which constant current source 54 is connected to terminal 13 is dependent upon the polarity of the current supplied to the base of transistor 16 necessary to achieve zero output voltage at terminal 14 with a zero input voltage at terminal 24. In this regard, if the voltage at terminal 14 is positive with a zero voltage of source 24, terminal 67 is connected to terminal 13, and terminal 64 is connected to the negative source potential of the operational amplifier; if the voltage at terminal 14 is negative with a zero voltage of source 24, terminal 64 is connected to terminal 13 and terminal 67 is connected to the positive source potential of the operational amplifier. The resistors of constant current sources 53 and 54 are adjusted as required to obtain zero voltage levels at inverting input terminal 12 and output terminal 14 with a zero voltage for source 24. These parameters produce the required bias conditions for the amplifier. The use of field effect transistors for current sources 53 and 54 is desirable because such transistors have the high impedance characteristics required of bias circuitry connected to terminals 12 and 13.

Figure 3:
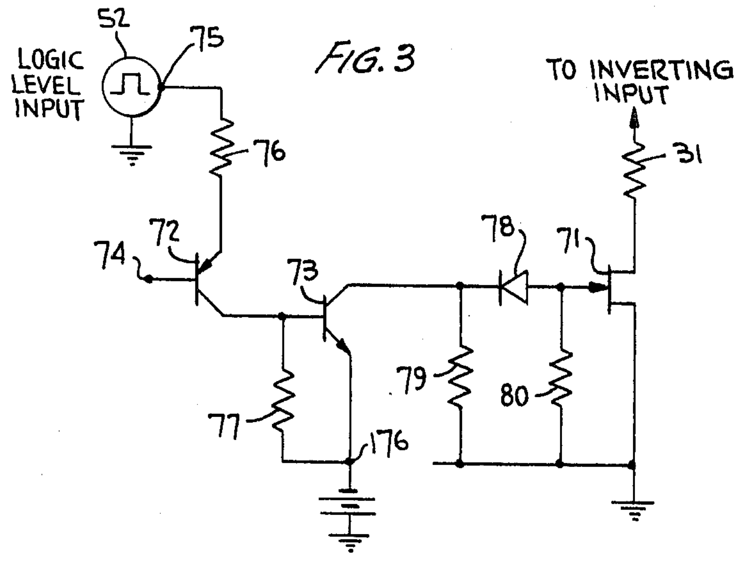
FIG. 3 is a circuit diagram of a typical electronic switch employed in the circuit of FIG. 1.

Reference is now made to FIG. 3 wherein there in illustrated a circuit diagram of a typical electronic, field effect transistor switch preferably employed for each of switches 41—50. Each switch includes field effect transistor 71, having the source drain electrodes thereof connected in series with the fixed resistance forming each branch arm of variable impedance 30; in the FIG. the branch is illustrated as including resistor 31 and its associated switch 41. By employing field effect transistor 71 as switch 41, the same impedance exists through the field effect transistor for both positive and negative signal currents and no voltage offset is introduced in series with resistance 31 while the transistor is switched on. In contrast, bipolar transistors and diodes both have asymmetrical current conducting impedance properties and introduce a substantial voltage offset.

The circuit for controlling conduction of field effect transistor 71 includes PNP transistor 72 and NPN transistor 73. The base of transistor 72 is connected to a suitable positive bias source at terminal 74, while the transistor emitter is responsive to a bilevel digital command signal generated at terminal 75 and derived from source 52. The signal at terminal 75 varies between a level of zero and +5 volts in a typical embodiment, and is coupled to the emitter of transistor 72 via current limiting resistor 76. In response to the positive voltage being coupled to terminal 75, transistor 72 conducts and positive current flows from the collector of transistor 72 to the base of transistor 73. In response to the positive current applied to the base of transistor 73, a negative, DC voltage connected to the transistor emitter through terminal 176 is coupled to the transistor collector. While a zero level input is applied to terminal 75 and the emitter collector path of transistor 72 is cut off, the emitter collector path of transistor 73 is also cut off since no base to emitter current flows. The function of resistor 77 is to prevent the leakage current of transistor 72 while transistor 72 is cut off from raising the base voltage of transistor 73 above the threshold of conduction for the latter transistor.

In response to negative current being supplied through the emitter collector path of transistor 73, negative current is applied through diode 78 and resistor 80 to develop a negative potential at the gate of field effect transistor 71 which cuts off the transistor. In response to transistor 73 being activated to a cutoff condition, no current is supplied by the voltage at terminal 176 to the gate electrode of field effect transistor 71 and any residual or interelectrode charge which may have built up on the capacitance between the electrodes of diode 78 or field effect transistor 71 is dissipated to ground through the shunt path comprising resistors 79 and 80. The gate potential of transistor 71 is thus at ground potential since no current flows through resistor 80, and the field effect transistor is in the conducting (switch closed) state. The purpose of diode 78 and resistor 79 is to prevent the off leakage current of transistor 73 from developing a small negative potential at the gate of transistor 71 thus modifying its on resistance; this leakage current must develop a potential across resistor 79 of approximately −0.4 v. before it exceeds the forward threshold potential of diode 78 and begins to develop a negative potential at the gate of transistor 71.

While there has been described and illustrated one specific embodiment of the invention, it will be clear that variations in the details of the embodiment specifically illustrated and described may be made without departing from the true spirit and scope of the invention. For example, the voltage divider comprising resistors 26 and 27 can be replaced with an operational amplifier having properly adjusted gain or a tapped transformer in the event that the voltage of source 24 is derived from an AC source. It may also be possible to replace the resistors 25—28 with other types of impedances which enable the relationship of equation (4) to be maintained.

I claim:

1. A computer circuit responsive to a voltage source comprising an operational amplifier having first and second signal input terminals and an output terminal. The voltage at the output terminal being responsive to the difference in magnitude of the voltages applied to said first and second input terminals, a first impedance connecting said source to said first input terminal a second impedance connected in a negative feedback path between said output terminal and first input terminal, means for applying a predetermined finite fraction of the voltage of said source to said second input terminal, said amplifier and negative feedback path maintaining the voltage at the second input terminal, and impedance means shunting said first input terminal, the fraction of the voltage source applied to the second terminal relative to the ratio of the values of the first and second impedances being such that the voltage at the output terminal is proportional to a predetermined constant times the voltage of the source divided by the value of the impedance means.

2. The circuit of claim 1 further including means for varying the value of said impedance means in response to a control signal.

3. The circuit of claim 2 wherein said impedance means includes a plurality of fixed resistances, a field effect transistor connected to each of said resistances, and means for changing the impedance of each of said transistors from a substantially open circuit to a substantially closed circuit in response to the control signal to selectively connect the resistances in shunt with the first input terminal and a ground terminal.

4. The circuit of claim 3 further including a constant current source connected to one of said input terminals.

5. The circuit of claim 4 wherein said constant current source is connected to said first input terminal and is adjusted to supply the bias requirements of the amplifier.

6. The circuit of claim 2 wherein a constant current source is connected to said first input terminal and is adjusted to supply the bias requirements of the amplifier.

7. A computer circuit responsive to a voltage source comprising an operational amplifier having first and second signal input terminals and an output terminal, the voltage at the output terminal being responsive to the difference in magnitude of the voltages applied to said first and second input terminals, a first impedance connecting said source to said first input terminal, a second impedance connected in a negative feedback path between said output terminal and first input terminal, the values of said first and second impedances being $Z_1$ and $Z_2$, respectively, means for applying a predetermined finite fraction of the voltage of said source to said second input terminal, said fraction being represented by $x$, said amplifier and negative feedback path maintaining the voltage at the first input terminal at the same amplitude as the voltage at the second input terminal, and impedance means shunting said first input terminal, the values of said first and second impedances and fraction being related by $$x+\frac{Z_1}{Z_1+Z_2}=1$$

8. The circuit of claim 7 wherein said means for applying includes a voltage divider having an impedance value of $Z_3$ connected between the second input terminal and one terminal of said source and another impedance value of $Z_4$ connected between another terminal of said source and the second input terminal, wherein $$\frac{Z_1}{Z_2}=\frac{Z_3}{Z_4}$$

the first impedance, said one terminal of said source and the portion of the voltage divider having a value of $Z_3$ having a common connection.

9. The circuit of claim 8 further including means for varying the value of said impedance means in response to a control signal.

10. The circuit of claim 9 wherein said impedance means includes a plurality of fixed resistances, a field effect transistor connected to each of said resistances, and means for changing the impedance of each of said transistors from a substantially open circuit to a substantially closed circuit in response to the control signal to selectively connect the resistances in shunt with the first input terminal and a ground terminal.

11. The circuit of claim 10 wherein a constant current source is connected to said first input terminal and is adjusted to supply the bias requirements of the amplifier.

12. The circuit of claim 9 wherein a constant current source is connected to said first input terminal and is adjusted to supply the bias requirements of the amplifier.

13. A computer circuit responsive to a voltage source and a digital command signal comprising an operational amplifier having first and second signal input terminals and an output terminal, the voltage at the output terminal being responsive to the difference in magnitude of the voltages applied to said first and second input terminals, a first impedance connecting said source to said first input terminal, a second impedance connected in a negative feedback path between said output terminal and first input terminal, means for applying a predetermined finite fraction of the voltage of said source to said second input terminal, said amplifier and negative feedback path maintaining the voltage at the first input terminal at the same amplitude as the voltage at the second input terminal, and variable impedance means responsive to the digital command signal so that the value of the impedance means is changed in steps in response to the magnitude of the digital command signal, said impedance means being connected in shunt with said first input terminal, the fraction of the voltage source applied to the second terminal relative to the ratio of the values of the first and second impedances being such that the voltage at the output terminal is proportional to a predetermined constant times the voltage of the source divided by the value of the variable impedance.

14. The circuit of claim 13 wherein said impedance means includes a plurality of fixed resistances, a field effect transistor connected to each of said resistances, and means for changing the impedance of each of said transistors from a substantially open circuit to a substantially closed circuit in response to the command signal to selectively connect the resistances in shunt with the first input terminal and a ground terminal.

PO-1050
(5/69)

UNITED STATES PATENT OFFICE
CERTIFICATE OF CORRECTION

Patent No. 3,588,530 Dated June 28, 1971

Inventor(s) Marion J. Langan

It is certified that error appears in the above-identified patent and that said Letters Patent are hereby corrected as shown below:

Column 2, line 43, "abject" should be -- object --.

Column 3, line 50, "17" should be -- 27 --.

" " line 70, "40" should be -- 41 --.

Column 4, line 62, "$E_{in}12$" should be -- $E_{in}/2$ --.

" " line 63, "$E_{in}12$" should be -- $E_{in}/2$ --.

Column 5, line 21, after "resistance" and before the comma insert -- 28 --.

" " after line 45 (first equation)

" $R_1 = \frac{1023}{1024} R$ " should be -- $R_{31} = \frac{1023}{1024} R$ --.

Column 6, line 56, "SImplifying" should be -- simplifying --.

Column 8, line 63, after "terminal" change "." to -- , --.

" " line 63, "The" should be -- the --.

" " line 67, after "minal" insert -- , --.

" " line 71, after "the", second occurrence, insert -- first input terminal at the same amplitude as the voltage at the --.

Signed and sealed this 28th day of December 1971.

(SEAL)
Attest:

EDWARD M.FLETCHER,JR.
Attesting Officer

ROBERT GOTTSCHALK
Acting Commissioner of Patents